(12) United States Patent
Halliday (10) Patent No.: US 10,261,175 B2
(45) Date of Patent: Apr. 16, 2019

(54) RANGING APPARATUS (71) Applicant: STMicroelectronics (Research & Development) Limited, Marlow, Buckinghamshire (GB)

(72) Inventor: William Halliday, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 267 days.

(21) Appl. No.: 15/151,844

(22) Filed: May 11, 2016

(65) Prior Publication Data
US 2017/0176577 A1   Jun. 22, 2017

(30) Foreign Application Priority Data
Dec. 18, 2015 (EP) ..................................... 1520115

(51) Int. Cl.
| | | |
|---|---|---|
| *G01S 7/48* | (2006.01) | |
| *G01S 7/486* | (2006.01) | |
| *G01S 17/00* | (2006.01) | |
| *G01S 17/10* | (2006.01) | |
| *G01S 17/87* | (2006.01) | |
| *G01S 17/89* | (2006.01) | |
| *H01L 27/144* | (2006.01) | |
| *H01L 31/107* | (2006.01) | |
| *H01L 31/173* | (2006.01) | |
| *H01S 5/026* | (2006.01) | |
| *H01S 5/183* | (2006.01) | |

(52) U.S. Cl.
CPC .......... *G01S 7/4863* (2013.01); *G01S 7/4865* (2013.01); *G01S 17/003* (2013.01); *G01S 17/10* (2013.01); *G01S 17/87* (2013.01); *G01S 17/89* (2013.01); *H01L 27/1443* (2013.01); *H01L 31/107* (2013.01); *H01L 31/173* (2013.01); *H01S 5/0262* (2013.01); *H01S 5/183* (2013.01)

(58) Field of Classification Search
CPC .................................. G01S 7/481; G01S 17/08
See application file for complete search history.

(56) References Cited

U.S. PATENT DOCUMENTS

2014/0071433 A1*   3/2014   Eisele ................... G01S 7/4816
356/5.01

FOREIGN PATENT DOCUMENTS

| | | |
|---|---|---|
| DE | 4439298 A1 | 6/1996 |
| EP | 1903299 A1 | 3/2008 |
| WO | WO-2011029645 A1 | 3/2011 |

OTHER PUBLICATIONS

EPO Search Report and Written Opinion for EP 15201151 dated Jun. 24, 2016 (7 pages).

* cited by examiner

*Primary Examiner* — Luke D Ratcliffe
(74) *Attorney, Agent, or Firm* — Crowe & Dunlevy (57) ABSTRACT

A ranging apparatus includes a first array with first light sensitive detectors configured to receive light which has been reflected by an object and generate an output. A second array, spaced apart from the first array by a spacing distance, is further included, the second array having second light sensitive detectors. The second array is configurable to either receive light which has been reflected by the object or to be a reference array and generate an output. A processor operates to determine a distance to the object in response to the outputs from the first and the second arrays.

39 Claims, 9 Drawing Sheets

RANGING APPARATUS

PRIORITY CLAIM

This application claims priority from European Application for Patent No. 15201151.6 filed Dec. 18, 2015, the disclosure of which is incorporated by reference.

TECHNICAL FIELD

Some embodiments relate to an apparatus and in particular, but not exclusively, to an apparatus with an array of photosensitive devices.

BACKGROUND

Devices for determining the distance to objects are known. One currently used method is called "Time of Flight" (ToF). This method comprises sending a light signal towards the object and measuring the time taken by the signal to travel to the object and back. The calculation of the time taken by the signal for this travel may be obtained by measuring the phase shift between the signal coming out of the light source and the signal reflected from the object and detected by a light sensor. Knowing this phase shift and the speed of light enables the determination of the distance to the object.

Single photon avalanche diodes (SPAD) may be used as a detector of reflected light. In general, an array of SPADs are provided as a sensor in order to detect a reflected light pulse. A photon may generate a carrier in the SPAD through the photo electric effect. The photo generated carrier may trigger an avalanche current in one or more of the SPADs in an SPAD array. The avalanche current may signal an event, namely that a photon of light has been detected.

SUMMARY

According to an aspect, there is provided a ranging apparatus comprising: a first array comprising a first plurality of light sensitive detectors configured to receive light which has been reflected by an object, said first array configured to provide an output; a second array spaced from the first array by a spacing distance and comprising a second plurality of light sensitive detectors, said second array being configurable to either receive light which has been reflected by the object or to be a reference array, said second array configured to provide an output; and a processor configured, in dependence on said outputs from the first and the second arrays to determine distance information associated with said object.

The second array may be configured to provide a reference array or receive light which has been reflected by the object when said ranging apparatus is set up.

The second array may be configured to switch between a first mode in which said second array provides a reference array and a first mode in which said second array is configured to receive light which has been reflected by the object.

The second array may be configured to switch between said first and second modes at intervals during said use of said apparatus.

The second array may be configured to provide a reference array during calibration.

When said second array is configured to receive light which has been reflected by the object, said processor may be configured to determine said distance information in dependence on information about the spacing distance.

The processor may be configured to receive digital information based on said outputs, said digital information comprising detected event information and respective time information.

The processor may be configured to determine first histogram information for the first array and second histogram information for the second array from said digital information and to determine a distance to said object from each of said first and second histogram information.

The processor may be configured to determine further first histogram information and further second histogram information and using said first histogram information, said second histogram information, said further first histogram information and said further second histogram information to determine movement of said object.

The processor may be configured to use said first and second histogram information to determine a distance to a further object.

The ranging apparatus may comprise a first lens arranged over said first array such that said first array is configured to have a different focal distance as compared to the second array.

The ranging apparatus may comprise second lens is arranged of over said second array, said first and second lenses having different focal lengths.

The light sensitive detectors may comprise SPADS.

The ranging apparatus may comprise a light source configured to emit light which is reflected by said object.

According to another aspect, there is provided a ranging apparatus comprising: a first array comprising a first plurality of light sensitive detectors configured to receive light which has been reflected by an object, said first array configured to provide an output; a second array spaced from the first array by a spacing distance and comprising a second plurality of light sensitive detectors, said second array being configurable to either receive light which has been reflected by the object or to be a reference array, said second array configured to provide an output; and a processor configured, in dependence on said outputs from the first and the second arrays to determine distance information associated with said object.

According to another aspect, there is provided a ranging apparatus comprising: a light source configured to emit light; a first array comprising a first plurality of light sensitive detectors configured to receive light from said light source which has been reflected by an object, said first array configured to provide an output; a second array spaced from the first array by a spacing distance and comprising a second plurality of light sensitive detectors configured to receive light from said light source which has been reflected by the object, said second array configured to provide an output; and a processor configured, in dependence on said outputs from the first and the second arrays and said spacing distance to determine a di stance to said object.

An integrated circuit may comprise the ranging apparatus as discussed previously.

BRIEF DESCRIPTION OF THE DRAWINGS

Some embodiments will now be described by way of example only and with reference to the accompanying Figures in which.

DETAILED DESCRIPTION

Figure 1:
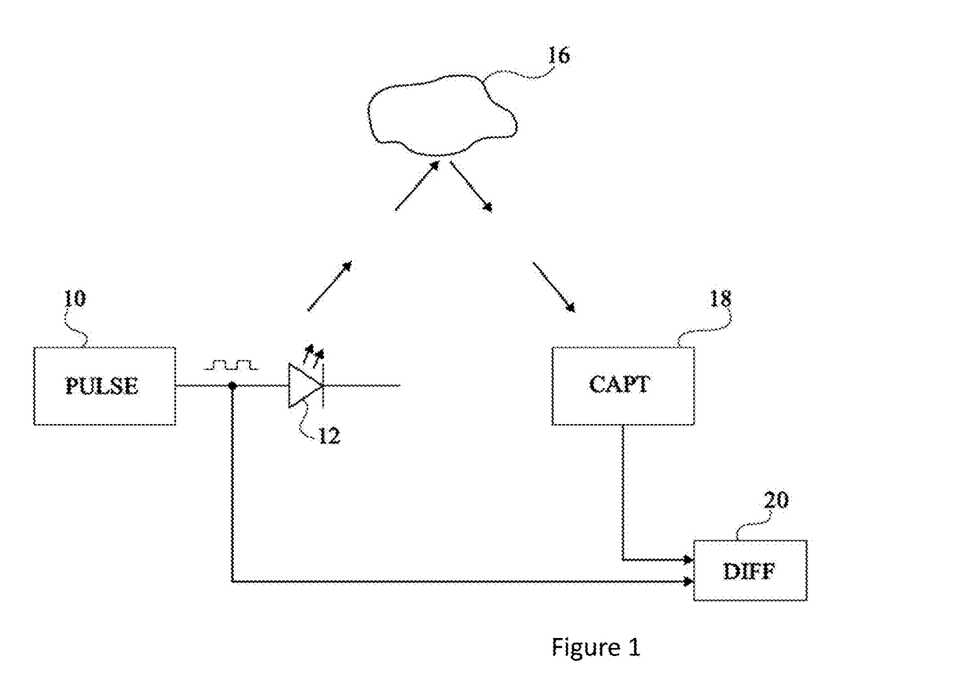
FIG. 1 illustrates principle of the "time of flight" method for determining the distance to an object.

FIG. 1 illustrates the general principle of a "Time of Flight" method.

In FIG. 1, a generator 10 (PULSE) provides a periodic electric signal, for example, square-wave shaped. This signal powers a light source 12. An example of a light source 12 may be a light-emitting diode, or any known lighting device, for example, a laser diode. The signal coming out of light source 12 is transmitted towards an object 16 and is reflected by this object. The reflected light signal is detected by a light sensor 18 (CAPT). The signal on sensor 18 is thus phase-shifted from the signal provided by the generator by an angle which correlates with the distance to object 16.

Calculation block 20 (DIFF) receives the signals generated by generator 10 and by sensor 18 and calculates the phase shift between these signals to obtain the distance to object 16. In some embodiments, a reference sensor is used. The reference sensor will be positioned so as to receive the light emitted by the light source, and is close to the light source. The distance to the object may be determined using the timing difference between the reference sensor receiving the light from the light source and the sensor 18 receiving the light from the reflected object.

Figure 2A:
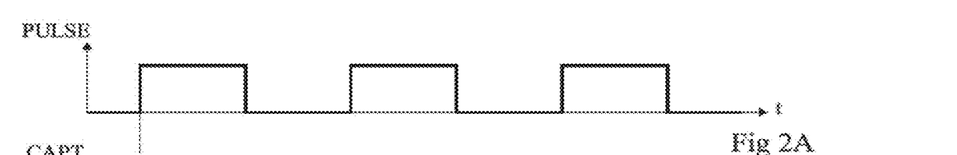
FIGS. 2A to 2C are timing diagrams illustrating results obtained by means of the device of FIG. 1, as well the operation of "SPADs"
Figures 2B, 2C:
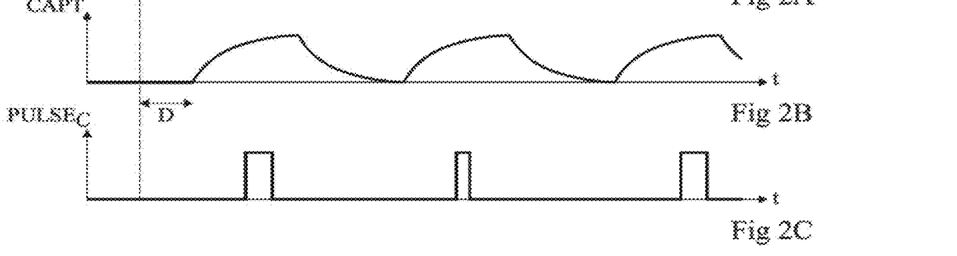

FIGS. 2A to 2C are timing diagrams illustrating the operation of a circuit such as that in FIG. 1. FIG. 2A illustrates a periodic signal PULSE capable of being provided by the generator 10 of FIG. 1. FIG. 2B illustrates the signal CAPT received by sensor 18. Due to interactions with the outside and to the components forming sensor 18, the signal received by this sensor has, in this example, variations in the form of capacitor charges and discharges. The signal on sensor 18 is phase-shifted from the signal coming out of generator 10 by a delay D.

The sensor 18 may integrate one or several photo detection elements enabling the detection of the signal received after reflection on the object 16. Such elements may be rapid charge transfer photodiodes. Single-photon avalanche diodes, or "SPADs", also called Geiger mode avalanche photodiodes, may also be used. These devices have a reverse biased p-n junction in which a photo-generated carrier can trigger an avalanche current due to an impact ionization mechanism. SPADs may be designed to operate with a reverse bias voltage well above the breakdown voltage.

FIG. 2C illustrates the signal (PULSE) generated by sensor 18, in the case where this sensor contains such a SPAD.

SPADs operate as follows. At an initial time, the diode is biased to a voltage larger than its breakdown voltage. The reception of a photon in the diode junction area starts an avalanche in the diode, which creates an electric pulse. The diode is then biased back to a voltage smaller than the breakdown voltage, so that the SPAD reacts again to the reception of a photon. SPADs can currently be used in cycles having reactivation periods shorter than 10 ns. Thereby, SPADs can be used at high frequency to detect objects at relatively short distances from the measurement device, for example, distances ranging from a few centimeters to a few tens of centimeters. In different embodiments, different ranges may be supported.

As illustrated in FIG. 2C, if SPADs receive a light signal such as described in relation to FIG. 2B, the diode avalanche time may vary with respect to this signal. The graph of the number of pulses versus time reflects the power-time profile of the light received by the SPAD. Thus, in the case illustrated in FIGS. 2A to 2C, on a large number of acquisitions, the graph of the pulse transmission by the SPAD substantially follows the curve of FIG. 2B.

To obtain information relative to the distance to an object, a circuit and a method using data obtained from a device will now be described. Ranging is the method of obtaining a distance measurement.

Figure 3:
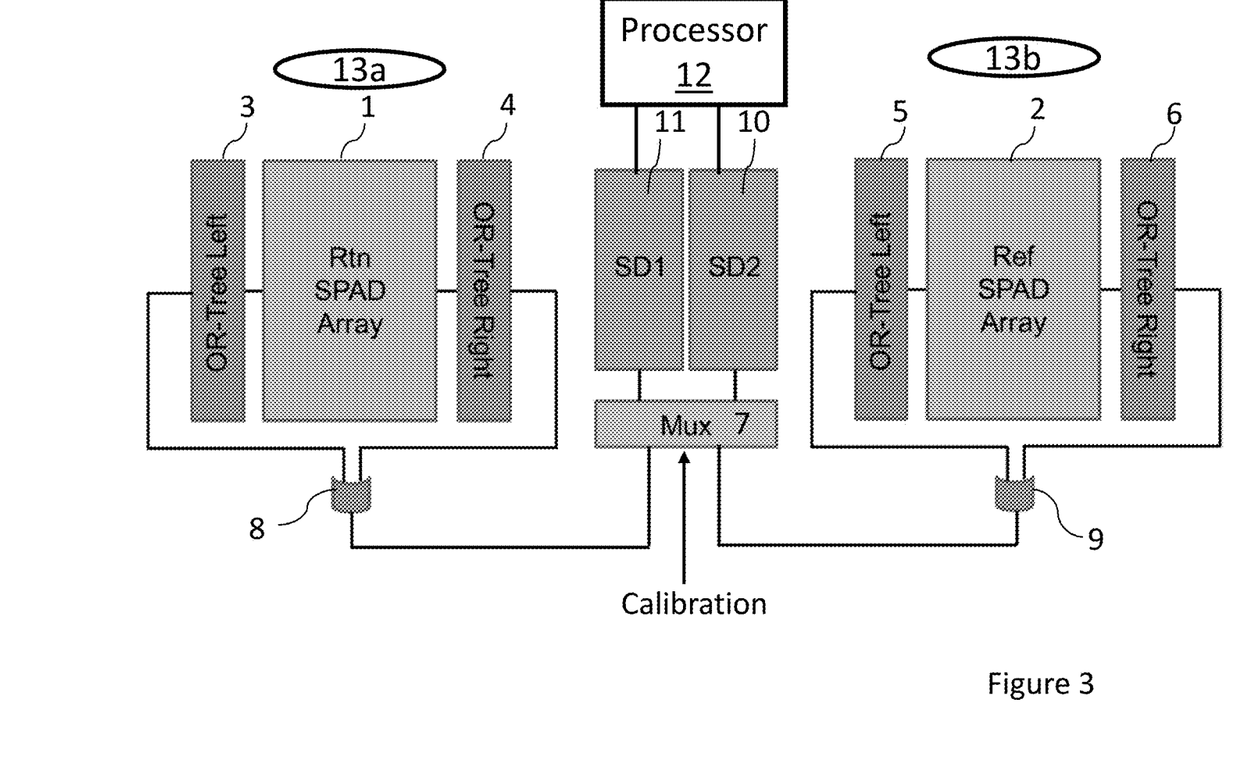
FIG. 3 shows a block diagram of an embodiment.

Reference is now made to FIG. 3 which schematically shows an overview of an embodiment. The arrangement comprises a first SPAD array 1 and a second SPAD array 2. Each SPAD array comprises a plurality of SPAD devices.

The first SPAD array 1 provides a plurality of outputs. By way of example, each SPAD of the array may provide an output. The respective outputs of the first SPAD array 1 are provided to a left side OR-tree 3 if the SPAD is on the left side of the first SPAD array or a right side OR-tree 4 if the SPAD is on the right side of the first SPAD array.

Likewise the second SPAD array 2 provides a plurality of outputs. Again, by way of example, each SPAD of the array may provide an output. The respective outputs of the second SPAD array 2 are provided to a left side OR-tree 5 if the SPAD is on the left side of the second SPAD array or a right side OR-tree 6 if the SPAD is on the right side of the second SPAD array.

The outputs from the left side OR-tree and the right side OR-tree for each array are combined by a respective OR element 8 and 9 to provide inputs to a multiplexer 7. In some embodiments, a calibration input may also be provided to the multiplexer 7. The outputs from the multiplexer are provided to first and second data processing (SD) arrangements 11 and 10. The first data processing arrangement 11 processes the data received from the first array and the second data processing arrangement 10 processes the data received from the second array. These arrangements may provide digital data which is passed to a processor 12 which may generate histogram data as discussed later and determine distance information therefrom.

The two SPAD arrays and associated circuitry can be used to provide a stereoscopic perspective. Each of the arrays is able to capture a reflected beam and the interspatial distance may be used to provide a stereoscopic perspective.

Having two images of the same target may improve the detection and tracking of the target. This may be especially the case where single point ambient lighting might be within the field of view or where there is a high level of background clutter (for example, where imaging the varying detectable surface of fingers passing over the sensor either spread or closed).

Having two detectors can also be used to address long range and short range detection solutions using two different lensing solutions over each SPAD array. As is shown schematically in FIG. 3, the first array 1 is provided with a lens 13a and the second array is provided with a second lens 13b. The lenses are arranged so that light reflected from an object will pass through the respective lens before impinging on the detector.

One lens would be designed to focus light at a relatively long range and the other lens would be designed to focus at a relatively shorter range. This means that a single sensor can have two zones of high ranging sensitivity that may be separate or overlapping. Since the light returned from the target is from a single emitter pulse and since the two SPAD arrays are part of a single sensor device, the two ranging channels are very well correlated and relative distance measurement would be very accurate. Since timing is synchronous between the two arrays, distance measurement can be handed over from one ranging circuit to another as the other as the target moves from one sensitivity zone to the other zone. So, the object can be tracked more accurately across a wider range of distances than a single-lensed, single array system could manage.

In some embodiments, only one array is provided with a lens such that the array which is without a lens may be focusing at a different range to that of the array with the lens.

A decision may be made by controlling logic at to which array is detecting appropriate data.

In some embodiments, the issue of the return spot (reflected light) wandering off the array at close distances can be addressed. In a single channel sensor as the target moves closer to the sensor, the center peak of the reflected light that lands on the sensor moves. If the spot wanders off the array, the multimode nature of the emitted light and the typical beam profile of light emitters such as VCSELs (vertical-cavity surface-emitting laser) results in a substantial ranging error occurring.

One solution would be to have a wide sensor array to ensure the center peak can always be captured but that there may be issues with timing and layout in the silicon not to mention power issues. In a two channel system (provided by having two arrays), the lens (or aperture) of the second channel or array could be positioned with an offset relative to the array, resulting in the center peak landing off-center at a relatively longer range. As the target gets closer the center peak moves off the center of the array of the first channel, but moves closer to the center of the array on the second channel. The first channel will experience a ranging error problem but the second channel will be able to operate to a much lower target distance without the ranging error occurring.

This dual channel technique may improve the range or distance measurement considerably meaning a single device could address a relatively wide range of ranging applications.

A time of flight based system, such as used in embodiments, can compensate for parallax since the range to the target and the angle within the field of view FOV can be determined. This form of triangulation may improve range or distance measurements and may allow a moving object to be tracked It should be appreciated that the applications for which the embodiment may be used may depend on the distance between the two arrays. In some embodiments, the distance may be of the order between 2 to 5 mm. In some embodiments the arrangements may be able to determine the distance of objects at relatively close range. For example, distances of 40 cm or less are measured. However, it should be appreciated that these sizes are by way of example only and in other embodiments, different spacing between the array and/or different distances may be supported.

Some embodiments may thus use a time of flight based architecture to combine stereoscopic visions with time of flight information.

Currently time of flight applications use a single transmitter/single receiver approach to provide an absolute distance measurement. Some embodiments use time of flight to provide relative distance measurements, for example the distance between objects as opposed to absolute distance values.

Some embodiments allow the same arrangement to be used to achieve both absolute ranging and relative ranging techniques.

In some embodiments a common architecture may be used to provide on the one hand two (relative distance) ranging channels as well as on the other hand a single (absolute distance) ranging channel.

In some embodiments, the second array is used as a reference array or as a ranging array.

The second array may be used interchangeably as a reference array or a ranging array. This may be done as a fundamental configuration of the device. Whereupon in ranging only mode, ranging information could be considered as accurate in terms of relative ranging (i.e., absolute or relatively accurate distance measurement may not be so important). Alternatively, this may be provided as a dynamically switching function during use. In this latter case, switching between modes (referencing and ranging) could be a one-time calibration mode (production test), a regular re-calibration mode (for example at power-up) or a frequent re-calibration mode (at periodic intervals during continuous use). This would give the relatively accurate absolute measurement information either at all times or as frequently as the system might need it.

In some embodiments, if a histogramming technique is used, absolute ranging may also be achieved with both channels. This is discussed in more detail below. This may allow the sensor to track two targets at different with different histogramming set-ups and reflectances.

Dual channel ranging may provide one or more advantages. For example, the specified detection range of the device may be extended as compared to a single channel device by offering overlapping channels which are respectively optimized for long-distance and a short-distance.

In some embodiments, targets at different depths in the field of view can be independently discerned and tracked.

With a single transmitter/receiver arrangement, crossing targets at a fixed height give rise to changes in range measurements, and reflectance intensity. If the target is not uniformly flat then additional artifacts will result in a poorer ranging or distance calculation. A dual channel such as used in embodiments may improve the ranging capability in such a situation by using triangulation techniques. This is because the information is available from each of the arrays which can be used to detect more accurately the position, and not just its distance, of an object and hence track the object when it moves.

Some embodiments which use Time of Flight proximity sensors, may allow stereoscopic detection capabilities to be realized which when combined with time of flight information may allow one or more the following advantages to be achieved:
  Simple 3D reconstruction
  Improved target tracking Parallax compensation Compensation for range variation across field of view Improved SNR (signal to noise ratio) as there are two signals being captured.

Dual ranging channel capability

The histogramming techniques may permit depth mapping and target declutter using binning techniques to differentiate targets at different distances.

Parallax issues affecting traditional stereoscopic systems can be resolved with time of flight information.

Figure 10A:
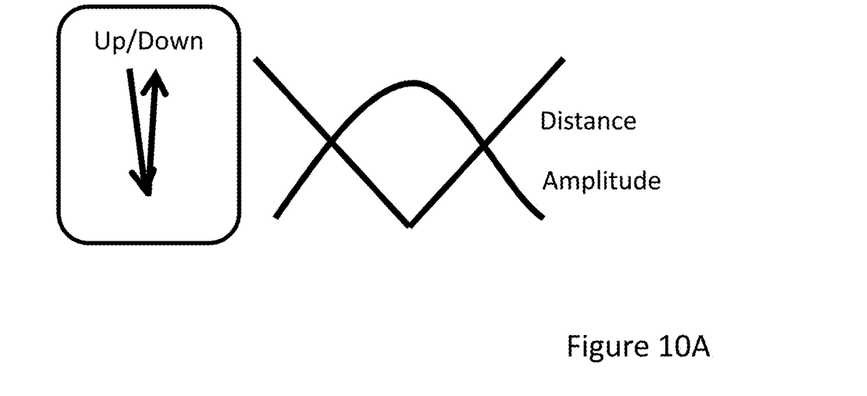
FIGS. 10A-10B show some examples of gestures and associated amplitude and distance; is an example of peak detection according to an embodiment.
Figure 10B:
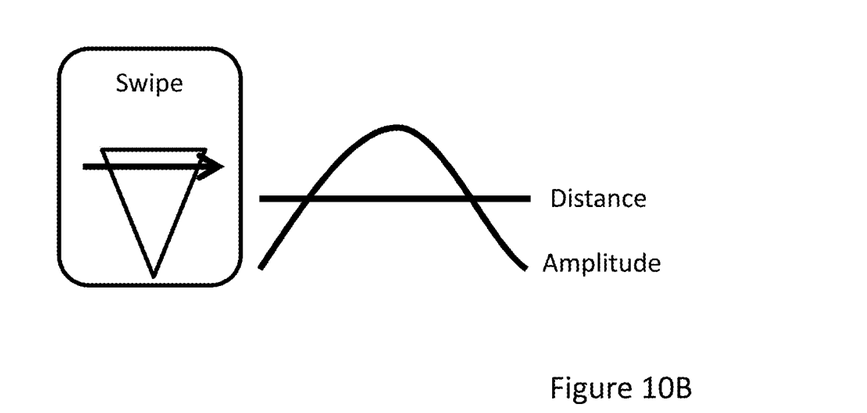

Reference is made to FIGS. 10A and 10B which show some examples of gestures which the arrangement of some embodiments may detect. The first gesture is where a user may move their hand towards a detector and then away (FIG. 10A). Thus, the distance will decrease and then increase. The corresponding amplitude measurement is shown. Generally, the amplitude will be higher when the object, for example the user's hand, is closer to the detector.

A second example of a gesture which can be detected is a swiping gesture (FIG. 10B). With the swiping gesture, generally, the user's hand is at a relatively constant distance from the detector. The amplitude will have a similar profile to the up and down gesture.

Figure 11:
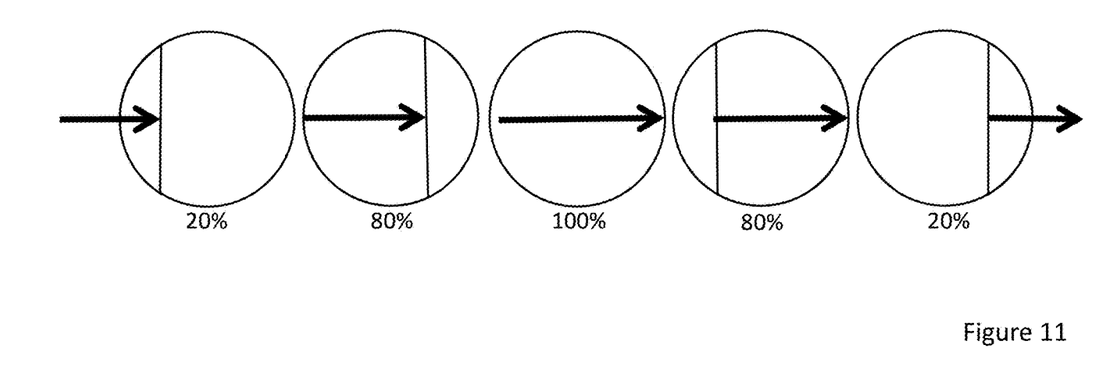
FIG. 11 shows lateral motion estimation.

Reference is made to FIG. 11 which shows a method for lateral motion estimation. Generally, as a user's hand moves passed a detector, the percentage of the field of view which is filled will change. This is represented schematically in FIG. 11. As the user's hand moved from left to right, the fill factor will gradually increase until a hundred percent of the field of view is filled by the object and then will decrease again. The percentage of the field of view filled by an object is generally independent of the object distance. It should be appreciated that the speed of gesture will determine the rate at which range information should be gathered.

Figure 12:
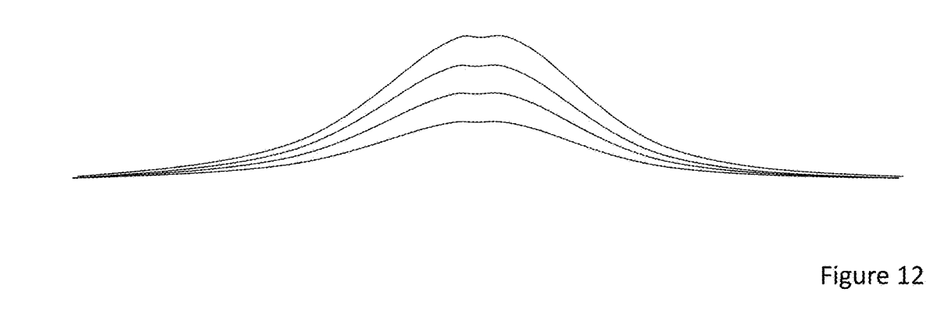
FIG. 12 shows normalized amplitude information.

Reference is made to FIG. 12 which shows the normalization of the amplitude associated with measurements made for the movement shown in FIG. 11. The normalization uses for example distance information. The largest amplitude will be when the field of view is completely filled by the object. The lowest amplitude will occur when the movement is such that only 20% of the field of view is filled, for example at either end of the gesture movement.

Figure 13:
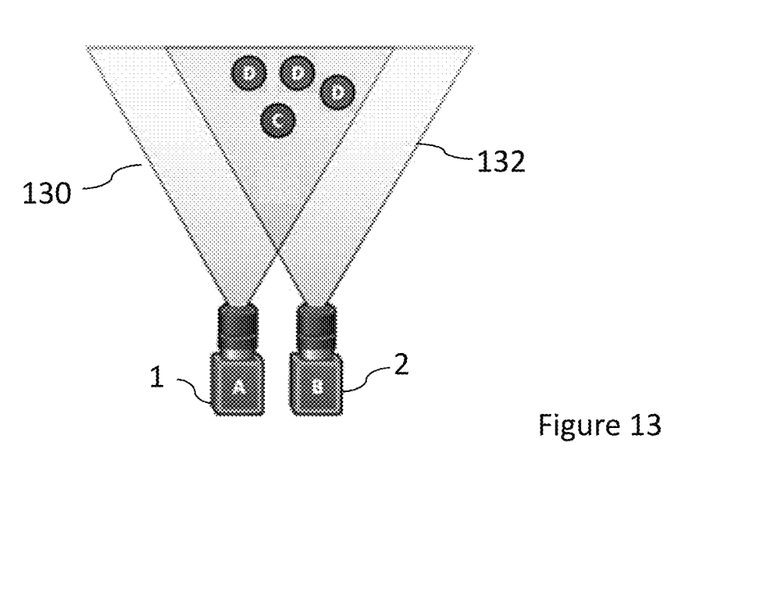
FIG. 13 shows an example which illustrates improved background decluttering.

As shown in FIG. 13, the arrays 1 and 2 each have a field of view which overlaps. The field of view of the first array is referenced 130 and the field of view of the second array is referenced 132. In this example shown, first object C is stationary and a second object D is moving. The histogram approach, as will be discussed in more detail later, allows the stationary object to be distinguished from the moving object.

Figure 14:
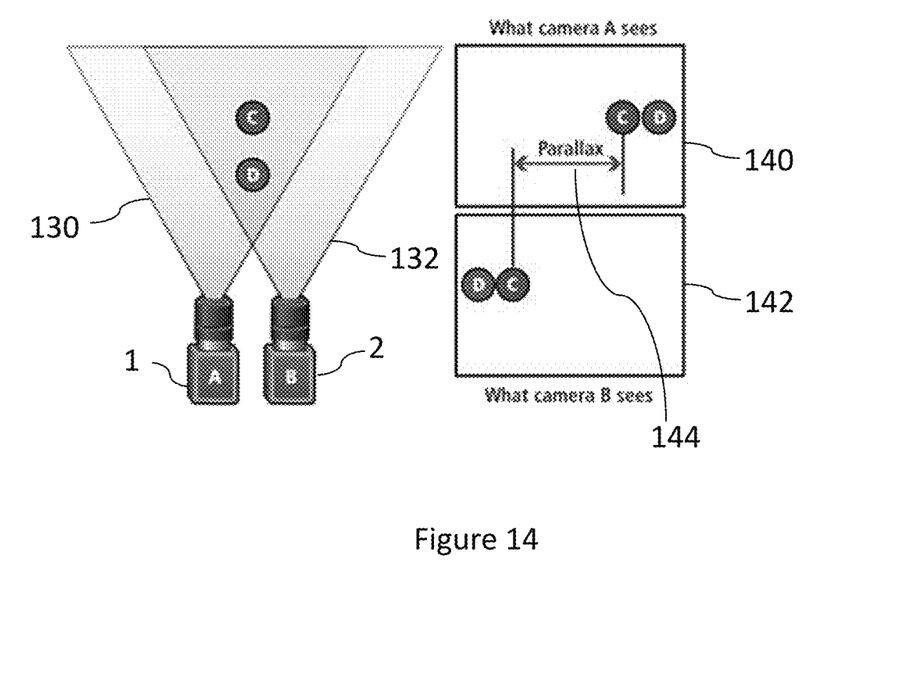
FIG. 14 shows an example addressing parallax issues.

FIG. 14 illustrates the parallax issue. In this example, two objects C and D are in the field of view of each of the arrays 1 and 2. Reference 140 represents the image or point captured by the first array and reference 142 represents the image or point captured by the second array. The distance between objects C in each of the images represents the parallax 144 caused by the spacing between the first and second arrays.

Because there are two arrays, using the information from each of the arrays, a distance for an object can be determined. That distance can effectively be represented by the overlying of the effect of arcs calculated by each array. The calculation may take into account the spacing between the two arrays.

In some embodiments, one array may be used as a reference array. This may be carried out where more accurate distance information is required. In some embodiments, the accuracy of information required for gesture recognition is not crucial. Where one array is used as a reference array, that array may be covered by the housing. The reference array may be configured to receive the light from the light emitter. For example, the light from the light emitter may reflect off the housing onto the reference array. The time between the light reaching the reference array and the light reaching the other array can be used in some embodiments to determine the distance to the object.

In some embodiments, the arrays may be used in either mode. There may be a selectable configuration for absolute distance (one array gets light reflected from objects and one array acts as a reference array) or for relative ranging options (both arrays will receive light reflected from objects). In embodiments, the same apparatus may be used for either mode with the apparatus being to be configured suitably in order to make the required calculations depending on the configuration.

A histogramming bin may be established for very short distances which could allow the light pulse to be detected directly on the same SPAD array as used for the return signal for reflected light from objects providing a reference signal without needing a dedicated reference SPAD array.

It should be appreciated that the distance between the two arrays may be used in order to effectively determine the position of an object and by tracking movement, the nature of the gesture can be detected. Accordingly, a snapshot of position will be obtained. For example, if a series of measurements are made where the distance gets progressively smaller and then larger, it can be determined that the gesture is the user moving his hand towards the detector and then away. If, on the other hand, the measurements show a series of movement where the distance remains constant but the field of view fill factor is changing, that can be used to determine that the user is making a swiping movement and also the direction of the swiping. It should be appreciated that the gestures given are by way of example only and of course other gestures that can be determined. The combination of determining the distance with the field of view fill factor can provide information allowing the gesture to be determined. Some embodiments may simply use determined position in order to identify gestures.

In embodiments movement data collected for one or more objects in a time frame is compared to one or more reference data. If the movement data matches one reference data, a gesture associated with the reference data may be recognized. With gesture detection, it may not be necessary to determine exact distances. However, in some embodiments the distances may be determined with relative accuracy.

Figure 5:
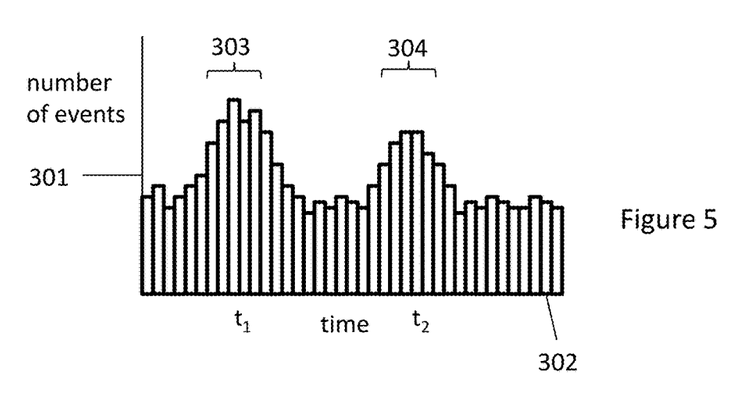
FIGS. 5-7 show examples of histogram produced in some embodiments.
Figure 6:
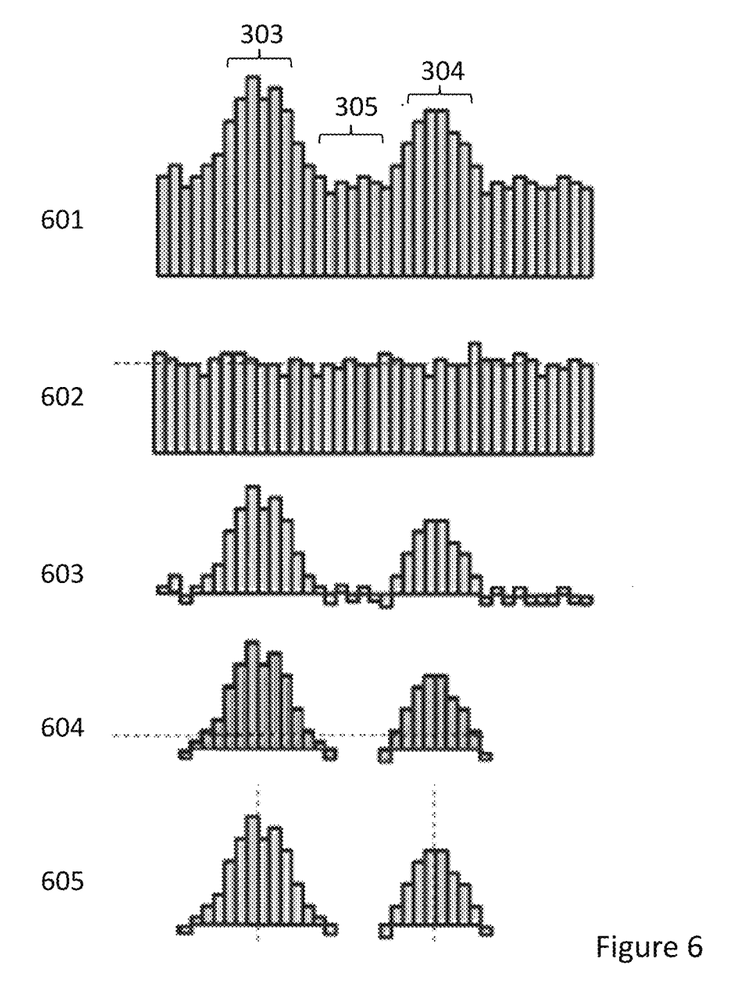
Figure 7:
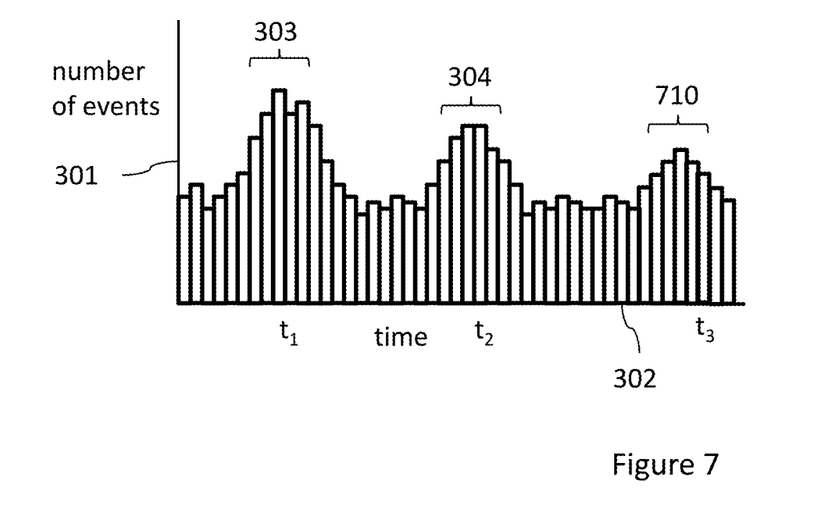

FIGS. 5 to 7 show histograms of light detected at one of the arrays with the number of events detected against time. As can be seen from FIG. 5 there is a first peak 303 of detected events at time t1 and a second peak 304 of events at time t2. These first and second peaks may be the result of the reflection of the emitted light from respective first and second objects.

It will be appreciated that the time t1 and the time t2 may be determined by a clock of the device. The time may be determined based on a timer that starts counting when a pulse of light is triggered and records when the events occur (the incidence of the reflected light). Information relating to a detected event and a time at which the event was detected may be passed to a time to digital converter which may provide a digital representation of the information. It may be appreciated that the time to digital converter (TDC) may receive an indication of an event from the sensor array and provide a digital indication of the event along with a time stamp. For example, the TDC may be further coupled to a clock. The processor may receive these digital indications and build up a histogram depicting the number of events that have occurred at each time bin.

The processor may receive information that an event has occurred and a time at which the event has occurred. The processor may gather this information and use it to generate a histogram. It will be appreciated that in order to gather enough information to generate a histogram a plurality of light pulses may be emitted in the determination of a distance from the remote object. Event information may be detected for one or more of these plurality of pulses and the information may be combined by the processor to generate a histogram.

It will be appreciated that the information in the histogram of FIG. 5 may represent the events detected over a number of pulses.

It will be appreciated that the processor may trigger the start of a pulse. The time at which the pulse was triggered may be known, however due to driver reaction time and PVT (process, voltage, temperature) variations, the time at which the pulse is emitted is not accurately known. For each pulse, the time of the event 302 may be considered to be the time between the pulse being triggered and the event being detected. Thus, event information for each of a plurality of pulses may include an indication of an event and a time corresponding to a time period of between the triggering of a pulse the event occurring.

It will be appreciated that the number of events detected at the times surrounding t1 and t2 may not be null. This is because other incidences of light may occur onto the sensor. For example, light from other sources may be incident on the sensor and/or light having a longer reflection path may fall onto the sensor.

It will be appreciated that event data is gathered for each pulse period and then event data from all the pulse periods are combined. The emitter may emit a number of pulses during a detection period and data is gathered for each of the pulse periods in the detection period. For each pulse period time and event information comprising an indication of any event and an associated time (corresponding to a period of time between that pulse being triggered and an event detected) will be gathered for the events occurring during the pulse period. The time and event information for each pulse period will be combined to generate the histogram.

In this case a pulse period may include both the period for which a light pulse occurs as well as a period of time between the pulse and the next pulse. In one example, a pulse may be 2 ns long and there may be a 10 ns break between pulses. In this example, the pulse period is 12 ns. It will, however, be appreciated that this is by way of example only and a pulse period may be chosen based on component capability and/or the distance desired to be detected and dependent on the application of the device.

Once the time and event information is gathered from the pulses in the detection period and the histogram is generated, the distance between the remote objects and the device may be determined from the time of the first peak 303 and the second peak 304. An average or mean time at which the first events occurred and an average or mean time at which the second events occurred may be determined and used to determine distance of the second object. It will be appreciated that different methods to detect the peaks may be used. For example a highest number of events per time may be used to detect a peak or an average number of events per time period may be used.

Figure 8:
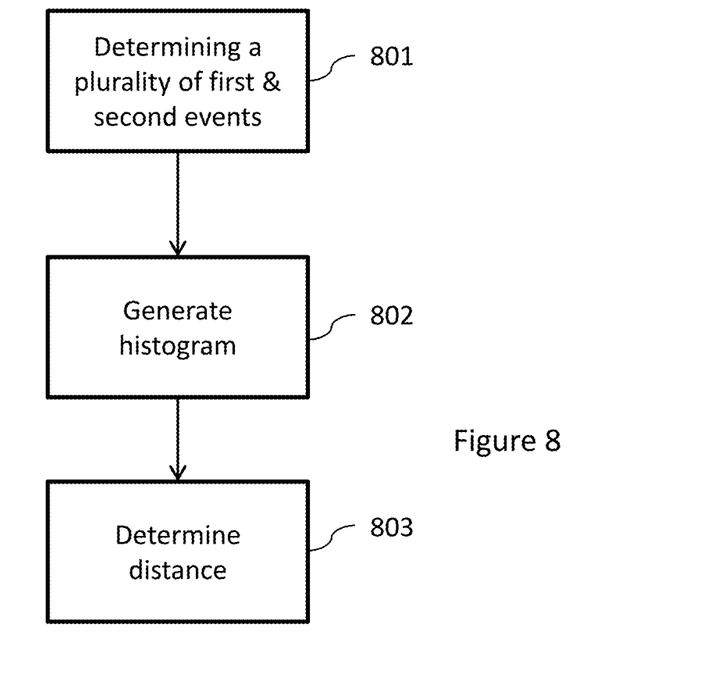
FIG. 8 is a flow diagram depicting the method steps associated with an embodiment.

FIG. 8 shows an example of the method steps that may be carried out in accordance with some embodiments.

At step 801, a plurality of first and second events are determined and a time at which each event occurred is recorded. It will be appreciated that the histogram may be updated as event data is received and thus event data is recorded in the histogram. It will also be appreciated that the event data may be recorded for a series of pulses in a detection period and the event time may be relative to each pulse.

At step 802, a histogram may be generated from the event information. It will be appreciated that in some embodiments, the histogram may be generated once the detection period has ended and based on all the time and event information for the detection period. In other embodiment the histogram may be generated during the detection period and updated as the time and event information is generated. In some embodiments the histogram may be generated by the processor in response to digital time information from the TDC. In other embodiments, the TDC may generate the histogram.

At step 803, the time of a first peak 303 corresponding to the first events and a second peak 304 corresponding to the second events of the histogram may be used to determine a time taken for light to travel to and from the respective remote objects.

Figure 9:
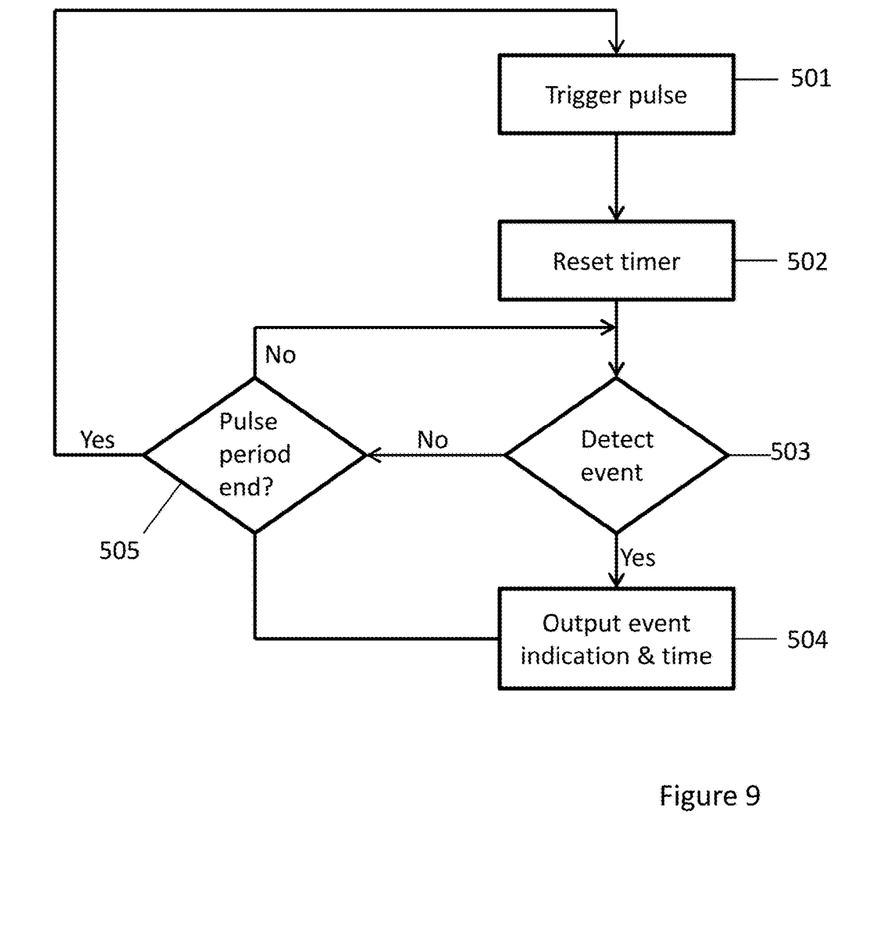
FIG. 9 is a flow diagram depicting the method steps associated with a further embodiment.

It will be appreciated that at step 801 a series of light pulses may be used to generate enough event data to generate the histogram. FIG. 9 shows the method steps associated with the series of pulses according to some examples.

At step 501 of FIG. 9 a first pulse is triggered and a timer is reset at 502. It will be appreciated that the timer will be reset at the time at which the pulse is triggered and not necessarily at the time at which the pulse is actually emitted. It will also be appreciated that in some cases, these steps 501 and 502 will be carried out simultaneously.

At step 503, it is determined whether an event is detected by the array. If an event is detected, an indication of the detected event is passed to the TDC where an event time is recorded at step 504. It will be appreciated that the time may correspond to the timer and thus a time period from triggering the first pulse. The method then proceeds to step 505. If no event is detected at 503, the method will also proceed to step 505.

At step 505 it is determined if the pulse period has ended. In other words it is determined whether it is possible for more events to occur due to the first pulse or if it is time for a second pulse. The pulse period may for example include the time of the pulse as well as a time between pulses. If the pulse period has not ended, the method proceeds to step 503 where more events are detected and output.

If the pulse period has ended at 505, the method proceeds back to steps 501 and 502 where a second pulse may be generated. In this manner a series of pulses forming a detection period may be generated and event and time information for the detection period may be provided to be used to generate a histogram. The method of FIG. 5 will exit when all the pulses in the detection period have been generated.

A resulting histogram is built, with an example given in FIG. 6. In order to determine a time of a first peak 303 and a second peak 304, the processor is configured to determine the locations of the first and second peaks. It will be appreciated that the processor may detect the position of the peaks and hence the time between the first peak and the second peak in any suitable fashion, however FIG. 6 shows one example of such a determination.

In the example of FIG. 6, four stages are carried out in the determination of a time difference between the first peak 303 and the second peak 304. A first stage 602 may occur prior to detection period and may comprise consist of building a histogram depicting an average event information triggered by ambient light. It will be appreciated that event with no triggered pulse, events may be detected on the array due to ambient light in the environment. In this example a separate timed sequence may be run with no light pulse emitted by the light emitter. A histogram may be generated by the processor showing the number of events against time detected under ambient light conditions. This is optional in some embodiments After the first stage, a histogram is generated in response to the detection period, such as described in relation to FIGS. 8 and 9. This may be a histogram as shown at 601.

A second stage may occur after the generation of the histogram and is shown at 603. The second stage may comprise subtraction of the expected average events caused by ambient light from the event information in the histogram generated from the detection period. It will be appreciated that this may be done on a bin by bin basis.

A third stage may comprise thresholding and is shown at 604. In the third stage 604, the approximate locations or times of the first and second peaks is established. The processor may determine whether event information is unlikely to be due to a reflected pulse and remove such data from the histogram. For example, very low levels or negative amounts of detected events may be removed.

In the fourth stage, a center of each remaining discrete peak may be found through for example peak detection and/or by a center of mass calculation and is shown at 605.

In the example of FIG. 6, the first peak 303 and the second peak 304 may be separated in time. For example there is a distinctive low 305 between the peaks 303 and 304.

However in some cases, for example where the objects are close together, the first and second peaks may overlap. In such cases, more complex algorithms may be used to resolve pulses overlapping in time. For example the histogram data may be low pass filtered and then differentiated to detect a change in the response.

FIG. 7 gives an example of embodiments where respective distances to three remote objects are determined. In this case, there will be three peaks—a first peak 303 due to the events triggered by reflection off the first object, a second peak 304 due to the events triggered by reflection off the second object and a third peak 710 due to the events triggered due to the reflection off the third object.

It will be appreciated that while the foregoing describes an arrangement which relies on a pulsed input waveform, it should be other embodiments may utilize other techniques, for example using a light source emitting a modulated intensity with a sinusoidal waveform. In this example, during the detection period, the light frequency and time and event information may be generated for each period of the emitted frequency until the end of a detection period.

It will be appreciated that embodiments of the disclosure may be implemented in a wide variety of applications. For example, ranging data extracted from the return and reference peak subtraction according to embodiments could be used for a large number of applications including user detection, auto-focus assist and machine vision.

Some embodiments have been described in the context of using a histogramming technique. However, this is only one way of analyzing the outputs from the zones of the arrays. In other embodiments, different techniques may be used to analyze the outputs from the arrays.

It will be appreciated that in some embodiments, the array may be a single photon avalanche diode array. It will be appreciated that a photon of light (as part of the light emitted from the emitter) may trigger an avalanche current in a SPAD and thus cause an output of an indication of an event.

In the foregoing a light emitter has been described. It will be appreciated that in some embodiments, the emitter may be a vertical surface cavity emitting laser (VSCEL) and may be driven by a VSCEL driver. However it will be appreciated that this is by way of example only and other suitable emitters may be used.

Figure 4:
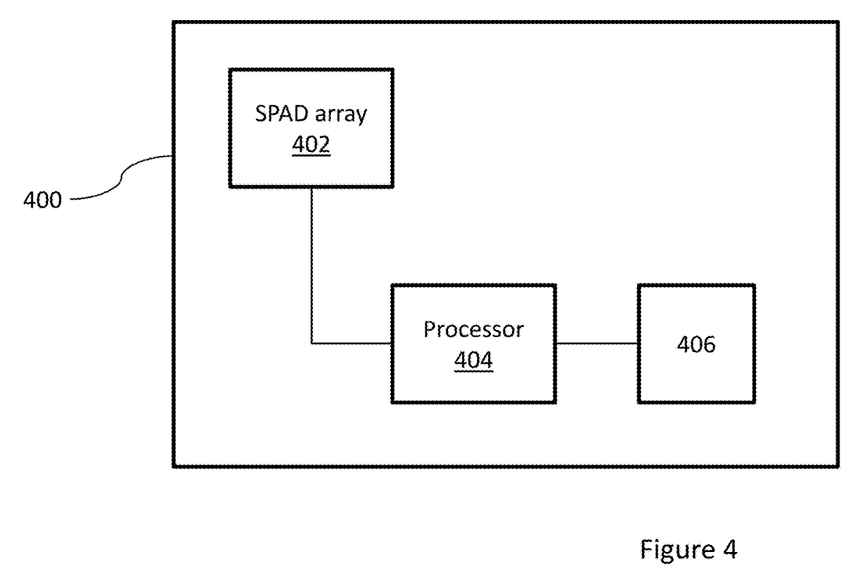
FIG. 4 shows a device with a SPAD array arrangement.

Some embodiments may be provided in a device 400 such as shown in FIG. 4. The device 400 may comprise a plurality of SPAD arrays as previously described and referenced 402. An output from the SPAD arrangement may be provided to a processor 404. Based on the output provided by the processor an information or control signal may be output to function block 406. The function block may be a controller which is configured to cause one or more actions in response to detecting a presence of an object. The function block may be a display which is configured to display a measurement result. The processor may be configured to identify one or more gestures from the information provided from the SPAD arrays.

It should be appreciated that the device may be any suitable device. By way of example only and without limitation, that device may be a mobile telephone, smart phone, tablet, computer, measuring device, switch controller such as for a light, controlling a water supply such as in a tap or toilet, door controller, distance sensor, impact controller, or any other suitable device.

Some embodiments may use other sensors, instead of SPADs. These sensors may be integrating elements generating events on reception of the light information. Some embodiments may use any photon sensitive detector.

Some embodiments may have infrared applications. The light source would be replaced by an infrared source and the detector array would be sensitive to infra-red radiation It should be appreciated that the above described arrangements may be implemented at least partially by an integrated circuit, a chip set, one or more dies packaged together or in different packages, discrete circuitry or any combination of these options.

For example the detector and optionally the processor may be provided on an integrated circuit or die. The detector and optionally the processor may be packaged in a module with the light emitter.

Various embodiments with different variations have been described here above. It should be noted that those skilled in the art may combine various elements of these various embodiments and variations.

Such alterations, modifications, and improvements are intended to be part of this disclosure, and are intended to be within the scope of the present invention. Accordingly, the foregoing description is by way of example only and is not intended to be limiting. The present invention is limited only as defined in the following claims and the equivalents thereto.

The invention claimed is:

1. A ranging apparatus, comprising:
   a first array comprising a first plurality of light sensitive detectors configured to receive light which has been reflected by an object, said first array configured to provide an output;
   a second array spaced from the first array by a spacing distance and comprising a second plurality of light sensitive detectors that is configurable in a first mode to operate as a reference array and receive light not reflected by the object and in a second mode to receive light which has been reflected by the object, said second array configured to provide an output; and a processor configured to switch the second array between the first mode and second mode and determine distance information associated with said object in dependence on said outputs from the first and the second arrays.

2. The ranging apparatus as claimed in claim 1, wherein configuration switching of the second array is established when said ranging apparatus is set up.

3. The ranging apparatus as claimed in claim 1, wherein said second array is configured in the first mode during calibration.

4. The ranging apparatus as claimed in claim 1, wherein when said second array is configured to receive light which has been reflected by the object, said processor is configured to determine said distance information in dependence on information about the spacing distance.

5. The ranging apparatus as claimed in claim 1, wherein said processor is configured to receive digital information based on said outputs from the first and second arrays, said digital information comprising detected event information and respective time information.

6. The ranging apparatus as claimed in claim 5, wherein said processor is configured to determine first histogram information for the first array from said digital information and second histogram information for the second array from said digital information and to determine a distance to said object from each of said first and second histogram information.

7. The ranging apparatus as claimed in claim 6, wherein the processor is configured to determine further first histogram information and further second histogram information and is further configured to determine movement of said object using said first histogram information, said second histogram information, said further first histogram information and said further second histogram information.

8. The ranging apparatus as claimed in claim 6, wherein said processor is configured to use said first and second histogram information to determine a distance to a further object.

9. The ranging apparatus as claimed in claim 1, further comprising a first lens arranged over said first array such that said first array is configured to have a focal distance different from a focal distance of the second array.

10. The ranging apparatus as claimed in claim 9, wherein a second lens is arranged of over said second array, said first and second lenses having different focal lengths.

11. The ranging apparatus as claimed in claim 1, wherein said light sensitive detectors comprise single photon avalanche diodes (SPADS).

12. The ranging apparatus as claimed in claim 1, further comprising a light source configured to emit light which is reflected by said object.

13. The ranging apparatus as claimed in claim 1, implemented using an integrated circuit.

14. A ranging apparatus, comprising:
a first array of light sensitive detectors configured to output first light detection signals in response to received light which has been reflected by an object;
a second array of light sensitive detectors configured to output second light detection signals in response to received light which has been reflected by said object; and a processor configured to determine a distance to said object in response to the first and second light detection signals;
wherein said second array of light sensitive detectors is configured for switching between operation in a first mode as a reference array to receive reference light and in a second mode to receive light which has been reflected by the object.

15. The ranging apparatus of claim 14, wherein the second array of light sensitive detectors is configured to switch between said first and second modes at intervals.

16. The ranging apparatus of claim 14, wherein said second array of light sensitive detectors is configured in the first mode during calibration.

17. The ranging apparatus of claim 14, wherein said processor is configured to determine said distance in dependence on a spacing distance between the first and second arrays of light sensitive detectors.

18. The ranging apparatus of claim 14, further comprising:
a first lens arranged over said first array of light sensitive detectors; and
a second lens arranged over said second array of light sensitive detectors;
wherein said first and second lenses have different focal lengths.

19. A ranging apparatus, comprising:
a first array comprising a first plurality of light sensitive detectors configured to receive light which has been reflected by an object, said first array configured to provide an output;
a second array spaced from the first array by a spacing distance and comprising a second plurality of light sensitive detectors that is configurable to receive light which has been reflected by the object and to be a reference array at different times, said second array configured to provide an output; and
a processor configured to:
receive digital information based on outputs from the first and second arrays, said digital information comprising detected event information and respective time information; and
determine first histogram information for the first array from said digital information and second histogram information for the second array from said digital information and to determine a distance to said object from each of said first and second histogram information.

20. The ranging apparatus as claimed in claim 19, wherein configuration of the second array to receive light and be the reference array at the different times is established when said ranging apparatus is set up.

21. The ranging apparatus as claimed in claim 19, wherein in use, the second array is configured to switch between a first mode in which said second array provides the reference array and a second mode in which said second array is configured to receive light which has been reflected by the object.

22. The ranging apparatus as claimed in claim 21, wherein said second array is configured to switch between said first and second modes at intervals during use of said ranging apparatus.

23. The ranging apparatus as claimed in claim 21, wherein said second array is configured in the first mode during calibration.

24. The ranging apparatus as claimed in claim 19, wherein when said second array is configured to receive light which has been reflected by the object, said processor is configured to determine distance information in dependence on information about the spacing distance.

25. The ranging apparatus as claimed in claim 19, wherein the processor is configured to determine further first histogram information and further second histogram information and is further configured to determine movement of said object using said first histogram information, said second histogram information, said further first histogram information and said further second histogram information.

26. The ranging apparatus as claimed in claim 19, wherein said processor is configured to use said first and second histogram information to determine a distance to a further object.

27. The ranging apparatus as claimed in claim 19, further comprising a first lens arranged over said first array such that said first array is configured to have a focal distance different from a focal distance of the second array.

28. The ranging apparatus as claimed in claim 27, wherein a second lens is arranged of over said second array, said first and second lenses having different focal lengths.

29. The ranging apparatus as claimed in claim 19, wherein said light sensitive detectors comprise single photon avalanche diodes (SPADS).

30. The ranging apparatus as claimed in claim 19, further comprising a light source configured to emit light which is reflected by said object.

31. The ranging apparatus as claimed in claim 19, implemented using an integrated circuit.

32. A ranging apparatus, comprising:
a first array comprising a first plurality of light sensitive detectors configured to receive light which has been reflected by an object, said first array configured to provide an output;
a second array spaced from the first array by a spacing distance and comprising a second plurality of light sensitive detectors that is configurable in a first mode to operate as a reference array and receive light not reflected by the object and in a second mode to receive light which has been reflected by the object, said second array configured to provide an output; and
a processor configured to switch the second array between the first mode and second mode and determine distance information associated with said object in dependence on said outputs from the first and the second arrays;
wherein said second array is switched by the processor between said first and second modes at intervals during use of said ranging apparatus.

33. The ranging apparatus as claimed in claim 32, wherein said second array is configured in the first mode during calibration.

34. The ranging apparatus as claimed in claim 32, wherein configuration of the second array to receive light and be the reference array at the different times is established when said ranging apparatus is set up.

35. A ranging apparatus, comprising:
a first array comprising a first plurality of light sensitive detectors configured to receive light which has been reflected by an object, said first array configured to provide an output;
a second array spaced from the first array by a spacing distance and comprising a second plurality of light sensitive detectors that is configurable to switch between receiving light which has been reflected by the object and being a reference array, said second array configured to provide an output; and
a processor configured to determine distance information associated with said object in dependence on said outputs from the first and the second arrays;
wherein when said second array is configured to receive light which has been reflected by the object, said processor is configured to determine said distance information in dependence on information about the spacing distance, with the information about the spacing distance being used to compensate said distance information for parallax resulting from the spacing difference.

36. The ranging apparatus as claimed in claim 35, wherein said processor is configured to receive digital information based on said outputs from the first and second arrays, said digital information comprising detected event information and respective time information.

37. The ranging apparatus as claimed in claim 36, wherein said processor is configured to determine first histogram information for the first array from said digital information and second histogram information for the second array from said digital information and to determine a distance to said object from each of said first and second histogram information.

38. The ranging apparatus as claimed in claim 37, wherein the processor is configured to determine further first histogram information and further second histogram information and is further configured to determine movement of said object using said first histogram information, said second histogram information, said further first histogram information and said further second histogram information.

39. The ranging apparatus as claimed in claim 37, wherein said processor is configured to use said first and second histogram information to determine a distance to a further object.

* * * * *

UNITED STATES PATENT AND TRADEMARK OFFICE
CERTIFICATE OF CORRECTION

PATENT NO. : 10,261,175 B2  
APPLICATION NO. : 15/151844  
DATED : April 16, 2019  
INVENTOR(S) : William Halliday Page 1 of 1

It is certified that error appears in the above-identified patent and that said Letters Patent is hereby corrected as shown below:

In the Specification

At Column 2, Line 57, please replace [[ di stance ]] with -- distance --  
At Column 3, Line 65, please replace [[ (PULSE) ]] with -- (PULSE$_C$) --

Signed and Sealed this  
Third Day of March, 2020

Andrei Iancu  
*Director of the United States Patent and Trademark Office*